(12) United States Patent
Zhou

(10) Patent No.: US 10,886,179 B2
(45) Date of Patent: Jan. 5, 2021

(54) SEMICONDUCTOR STRUCTURE AND FABRICATION METHOD THEREOF

(71) Applicants: Semiconductor Manufacturing International (Shanghai) Corporation, Shanghai (CN); SMIC New Technology Research and Development (Shanghai) Corporation, Shanghai (CN)

(72) Inventor: Fei Zhou, Shanghai (CN)

(73) Assignees: Semiconductor Manufacturing International (Shanghai) Corporation, Shanghai (CN); SMIC New Technology Research and Development (Shanghai) Corporation, Shanghai (CN)

( * ) Notice: Subject to any disclaimer, the term of this patent is extended or adjusted under 35 U.S.C. 154(b) by 23 days.

(21) Appl. No.: 16/117,451

(22) Filed: Aug. 30, 2018

(65) Prior Publication Data

US 2019/0122932 A1 Apr. 25, 2019

(30) Foreign Application Priority Data

Oct. 19, 2017 (CN) .......................... 2017 1 0976737

(51) Int. Cl.
*H01L 21/8234* (2006.01)
*H01L 21/02* (2006.01)
*H01L 21/311* (2006.01)
*H01L 27/088* (2006.01)
*H01L 21/027* (2006.01)
(Continued)

(52) U.S. Cl.
CPC .. *H01L 21/823431* (2013.01); *H01L 21/0217* (2013.01); *H01L 21/0228* (2013.01); *H01L 21/0273* (2013.01); *H01L 21/02164* (2013.01); *H01L 21/02208* (2013.01); *H01L 21/02274* (2013.01); *H01L 21/31053* (2013.01); *H01L 21/31144* (2013.01); *H01L 21/76224* (2013.01); *H01L 21/823418* (2013.01);
(Continued)

(58) Field of Classification Search
None
See application file for complete search history.

(56) References Cited

U.S. PATENT DOCUMENTS 9,508,604 B1* 11/2016 Sung .................... H01L 29/6656
2018/0226491 A1* 8/2018 Bi ........................ H01L 29/7827
(Continued)

FOREIGN PATENT DOCUMENTS

CN 105513965 A 4/2016

*Primary Examiner* — Long Pham
(74) *Attorney, Agent, or Firm* — Anova Law Group, PLLC

(57) ABSTRACT

A semiconductor structure and a method for fabricating the semiconductor structure are provided. The method includes providing a base substrate. The base substrate includes a plurality of non-device regions. The method also includes forming a middle fin structure and an edge fin disposed around the middle fin structure on the base substrate between adjacent non-device regions. In addition, the method includes forming a first barrier layer on sidewalls of the edge fin. Further, the method includes forming an isolation material layer over the base substrate, over a top of the edge fin, over sidewall and top surfaces of the middle fin structure, and over sidewalls of the first barrier layer. The isolation material layer has a material density smaller than the first barrier layer.

20 Claims, 6 Drawing Sheets

(51) Int. Cl.
*H01L 21/762* (2006.01)
*H01L 21/3105* (2006.01)

(52) U.S. Cl.
CPC .. *H01L 21/823481* (2013.01); *H01L 27/0886* (2013.01); *H01L 21/02219* (2013.01); *H01L 21/02271* (2013.01)

(56) References Cited

U.S. PATENT DOCUMENTS

2019/0067446 A1* 2/2019 Ching ................ H01L 27/0924
2019/0103304 A1* 4/2019 Lin ................ H01L 21/823821
2019/0122932 A1* 4/2019 Zhou .............. H01L 21/823418

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710976737.0, filed on Oct. 19, 2017, the entirety of which is incorporated herein by reference.

FIELD OF THE DISCLOSURE

The present disclosure generally relates to the field of semiconductor manufacturing and, more particularly, relates to a semiconductor structure and fabrication method thereof.

BACKGROUND

With the continuous development of semiconductor technology, the performance of integrated circuits is mainly improved by continuously reducing dimensions of devices in the integrated circuits to increase the speed of the integrated circuits. At present, due to the pursuit of high device density, high performance and low cost, semiconductor processes have advanced to nanotechnology process nodes, and the fabrication of semiconductor devices is limited by various physical limits.

As complementary metal-oxide-semiconductor (CMOS) devices continue to shrink, challenges from manufacturing and design have led to the development of three-dimensional designs, such as a fin field-effect transistor (FinFET). Compared with a planar transistor, the FinFET has superior performance in channel control and reduction of a short-channel effect, etc. A planar gate structure is disposed above the channel. A gate structure in the FinFET is disposed surrounding the fin, and, thus, is capable of controlling current from three surfaces and has more prominent current control performance.

However, the performance of a conventionally formed FinFET is poor and still needs to be improved. The disclosed methods and device structures are directed to solve one or more problems set forth above and other problems.

BRIEF SUMMARY OF THE DISCLOSURE

One aspect of the present disclosure includes a method for fabricating a semiconductor structure. The method includes providing a base substrate. The base substrate includes a plurality of non-device regions. The method also includes forming a middle fin structure and an edge fin disposed around the middle fin structure on the base substrate between adjacent non-device regions. In addition, the method includes forming a first barrier layer on sidewalls of the edge fin. Further, the method includes forming an isolation material layer over the base substrate, over a top of the edge fin, over sidewall and top surfaces of the middle fin structure, and over sidewalls of the first barrier layer. The isolation material layer has a material density smaller than the first barrier layer.

Another aspect of the present disclosure includes a semiconductor structure. The semiconductor structure includes a base substrate. The base substrate includes a plurality of non-device regions. The semiconductor structure also includes a middle fin structure and an edge fin disposed around the middle fin structure on the base substrate between adjacent non-device regions. In addition, the semiconductor structure includes a first barrier layer on sidewalls of the edge fin. Further, the semiconductor structure includes an isolation material layer over the base substrate, over a top of the edge fin, over sidewall and top surfaces of the middle fin structure, and over sidewalls of the first barrier layer. The isolation material layer has a material density smaller than the first barrier layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
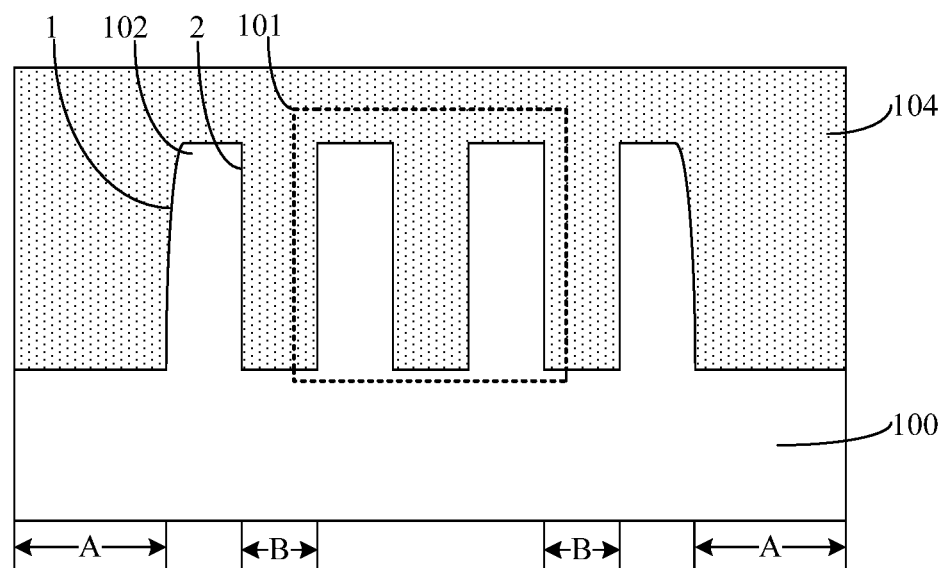
FIG. 1 illustrates a structural schematic of a semiconductor structure.

FIG. 1 illustrates a structural schematic of a semiconductor structure. Referring to FIG. 1, a base substrate 100 is provided. The base substrate 100 includes a plurality of non-device regions 'A'. A middle fin structure 101 and an edge fin 102 around the middle fin structure 101 are formed on the base substrate 100 between the non-device regions 'A'. The edge fin 102 and the middle fin structure 101 are spaced apart by an isolation region 'B'. An isolation material layer 104 is formed over the base substrate 100, over sidewall and top surfaces of the edge fin 102, and over sidewall and top surfaces of the middle fin structure 101.

The non-device region 'A' is not used to form a semiconductor device. The non-device region 'A' has a first dimension in a direction perpendicular to the sidewall of the edge fin 102. The isolation region 'B' has a second dimension in the direction perpendicular to the sidewall of the edge fin 102. To meet the requirements of high integration degree of the semiconductor devices, the second dimension is substantially small, and the second dimension is far smaller than the first dimension. The isolation material layer 104 is subsequently formed over the base substrate 100, and, thus, the isolation material layer 104 over the non-device area 'A' has a volume much larger than the isolation material layer 104 over the isolation region 'B'.

The isolation material layer 104 is made of silicon oxide. Forming the isolation material layer 104 includes a fluid chemical vapor deposition process. A parameter of the fluid chemical vapor deposition process includes a temperature in a range of approximately 30° C.-90° C. When forming the isolation material layer 104 by the fluid chemical vapor deposition process, a first sidewall 1 of the edge fin 102 is affected by a thermal process of the isolation material layer 104 over the non-device region 'A', while a second sidewall 2 of the edge fin 102 opposing to the first sidewall 1 of the edge fin 102 is affected by a thermal process of the isolation material layer 104 over the isolation region 'B'. Because the volume of the isolation material layer 104 over the non-device region 'A' is much larger than the volume of the isolation material layer 104 over the isolation region 'B', the thermal process has an influence on the first sidewall 1 of the edge fin 102 stronger than the second sidewall 2 of the edge fin 102. Therefore, after forming the isolation material layer 104, the edge fin 102 tends to be deformed toward the non-device region A, which causes a substantially large appearance difference between the edge fin 102 and the middle fin structure 101, and cannot effectively improve the consistency of the performance of the semiconductor device.

The present disclosure provides a semiconductor structure and a method for forming the semiconductor structure. A middle fin structure and an edge fin disposed around the middle fin structure may be formed on a base substrate between non-device regions. Before forming an isolation material layer over the base substrate, over sidewall and top surfaces of the edge fin, and over sidewall and top surfaces of the middle fin structure, a first barrier layer may be formed on the sidewalls of the edge fin. The first barrier layer may balance a force difference on sides of the edge fin during the formation of the isolation material layer, and prevent the edge fin from being deformed.

Figure 8:
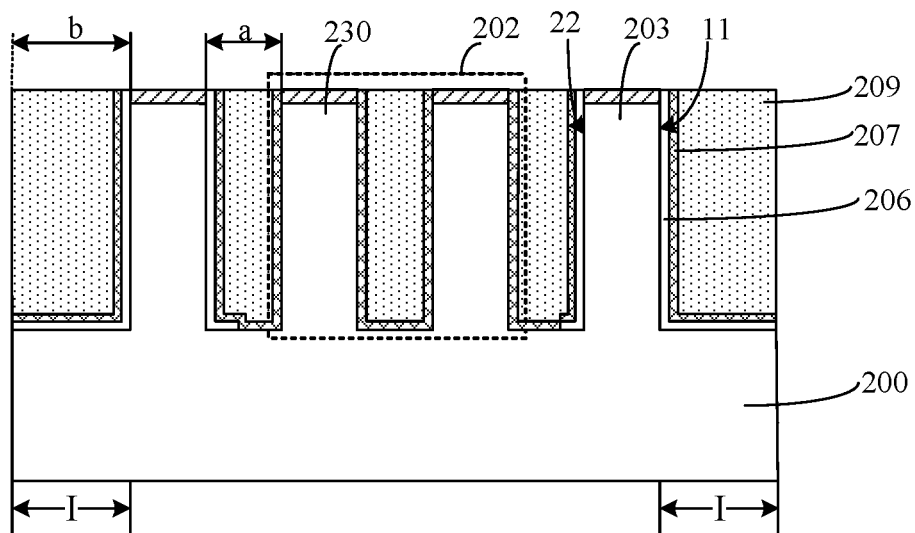
Figure 9:
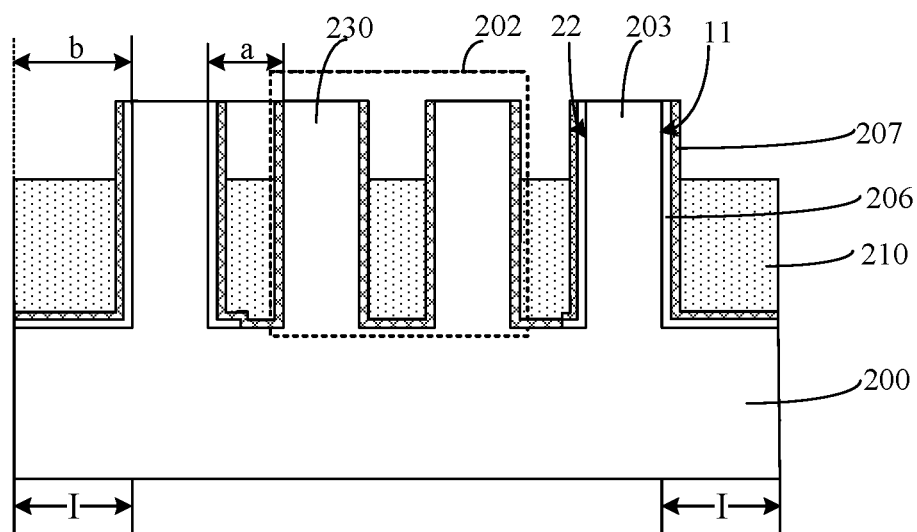
Figure 10:
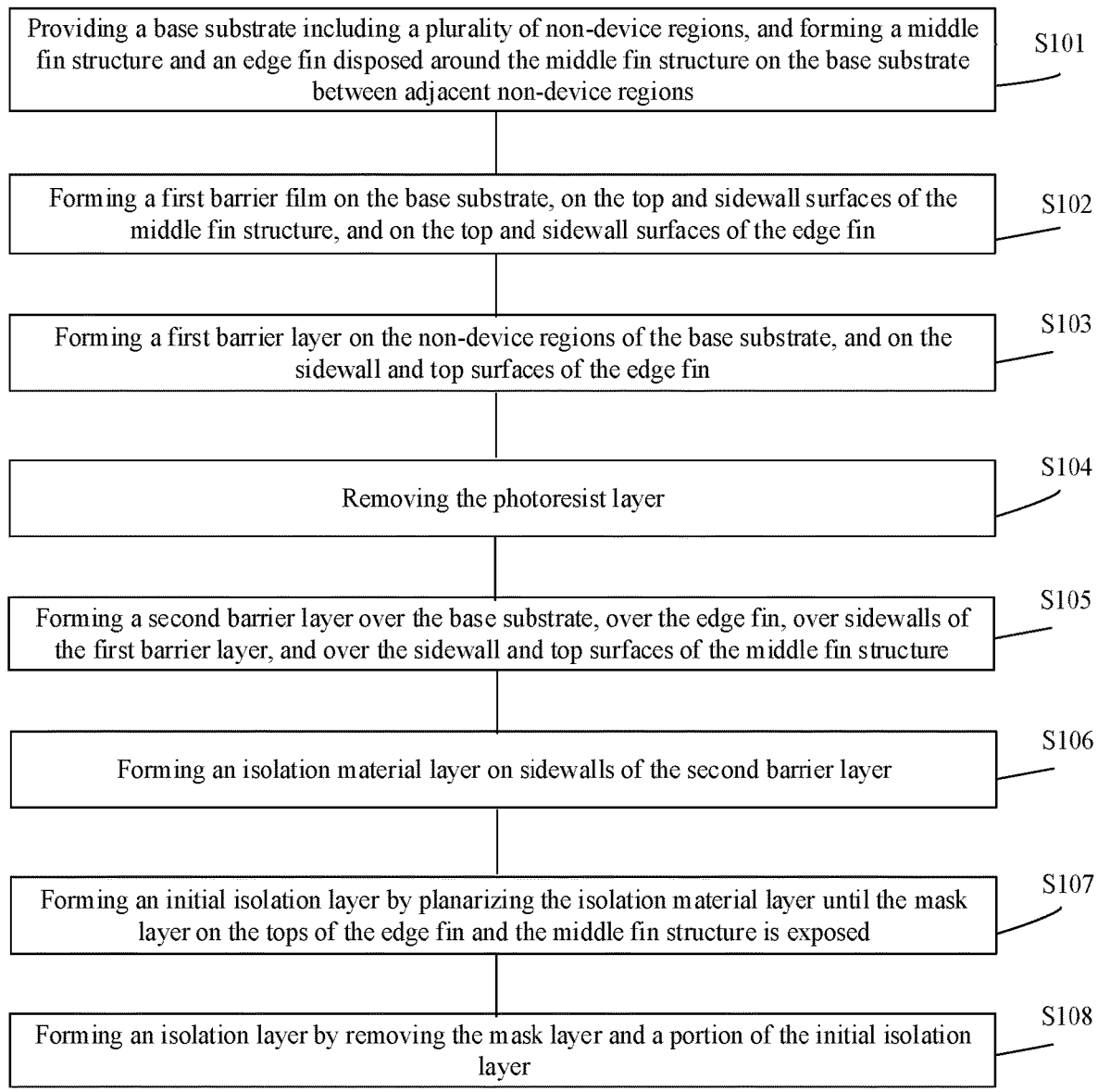
FIG. 10 illustrates an exemplary fabrication method for forming a semiconductor structure consistent with various disclosed embodiments of the present disclosure.

FIG. 10 illustrates an exemplary fabrication method for forming a semiconductor structure consistent with various disclosed embodiments of the present disclosure; and FIGS. 2-9 illustrate semiconductor structures corresponding to certain stages of the exemplary fabrication method.

Figure 2:
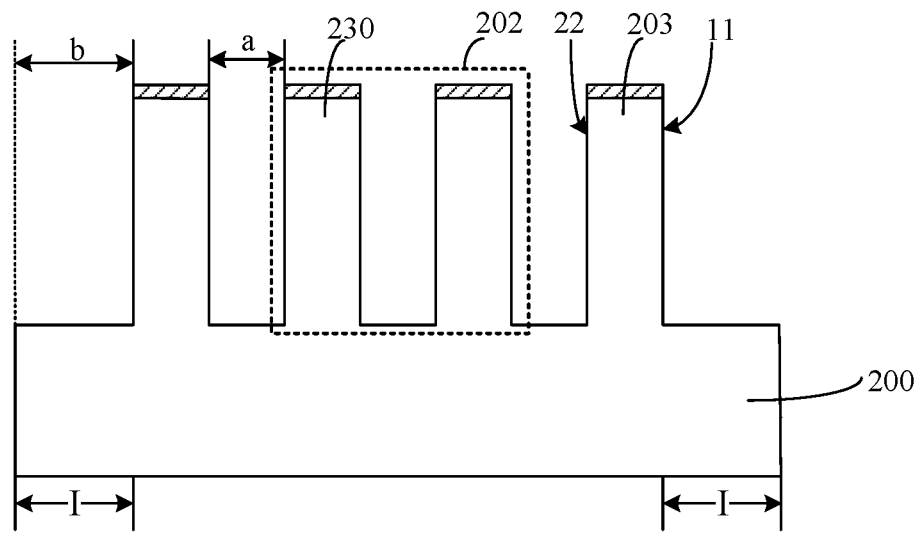
FIGS. 2-9 illustrate semiconductor structures corresponding to certain stages for forming an exemplary semiconductor structure consistent with various disclosed embodiments of the present disclosure.

As shown in FIG. 10, at the beginning of the fabrication method, a base substrate with certain structures may be provided (S101). FIG. 2 illustrates a corresponding semiconductor structure.

Referring to FIG. 2, a base substrate 200 may be provided. The base substrate 200 may include a plurality of non-device regions I. A middle fin structure 202 and an edge fin 203 disposed around the middle fin structure 202 may be formed on the base substrate 200 between adjacent non-device regions I.

In one embodiment, forming the substrate 200, the edge fin 203, and the middle fin structure 202 may include providing an initial base substrate, forming a mask layer on the initial base substrate to partially expose the initial base substrate, and etching the initial base substrate using the mask layer as a mask to form the base substrate 200, and the middle fin structure 202 and the edge fin 203 on the base substrate 200.

In one embodiment, the initial base substrate may be made of silicon. Correspondingly, the base substrate 200, the edge fin 203, and the middle fin structure 202 may be made of silicon.

In another embodiment, the initial base substrate may be made of germanium, silicon germanium, silicon-on-insulator, or germanium-on-insulator, etc. Correspondingly, the base substrate, the edge fin, and the middle fin structure may be made of germanium, silicon germanium, silicon-on-insulator, or germanium-on-insulator, etc.

The mask layer may be made of silicon nitride, silicon oxide, or silicon oxynitride, etc. The mask layer may serve as a mask for forming the base substrate 200, the edge fin 203, and the middle fin structure 202.

The middle fin structure 202 may include a plurality of first fins 230. In one embodiment, the number of the first fins 230 may be two, and the two first fins 230 may be arranged in parallel in a direction perpendicular to a length direction of the first fin 230.

In another embodiment, the number of the first fins may be one, or more than two. The more than two first fins may be arranged in parallel in the direction perpendicular to the length direction of the first fin 230.

In one embodiment, the edge fin 203 may be arranged in parallel to the first fin 230 in the direction perpendicular to the length direction of the first fin 230. In another embodiment, the edge fin may be arranged in parallel to the first fin in a direction parallel to the length direction of the first fin.

The non-device region I may not be used to form a semiconductor device. The base substrate between the adjacent non-device regions I may be used to form a semiconductor device. The non-device region I may have a first dimension 'b' in a direction perpendicular to a sidewall of the edge fin 203, and the edge fin 203 and the middle fin structure 202 may be spaced apart by a second dimension 'a'. The second dimension 'a' may be smaller than the first dimension 'b'. In one embodiment, the first dimension 'b' may be above 56 nm, and the second dimension 'a' may be in a range of approximately 32 nm-40 nm. The second dimension 'a' may be equal to a spacing between adjacent first fins 230.

The sidewalls of the edge fin 203 may include a first sidewall 11 and a second sidewall 22 opposing to the first sidewall 11. The first sidewall 11 of the edge fin 203 may be close to the non-device region I, and the second sidewall 22 of the edge fin 203 may be close to the middle fin structure 202.

Figure 3:
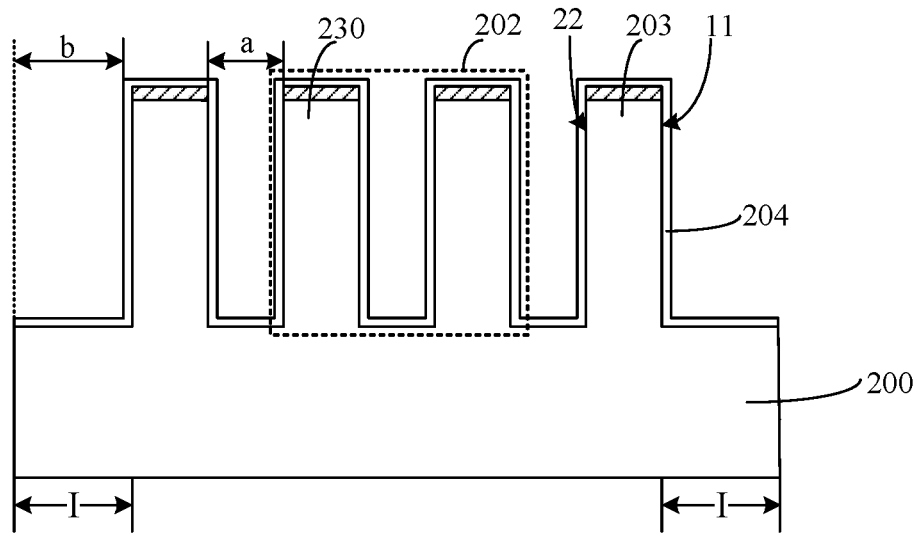

Returning to FIG. 10, after providing the base substrate with the edge fin and the middle fin structure, a first barrier film may be formed (S102). FIG. 3 illustrates a corresponding semiconductor structure.

Referring to FIG. 3, a first barrier film 204 may be formed on the base substrate 200, on the top and sidewall surfaces of the middle fin structure 202, and on the top and sidewall surfaces of the edge fin 203. In one embodiment, the first barrier film 204 may be made of silicon nitride. In another embodiment, the first barrier film may be made of silicon oxide.

In one embodiment, forming the first barrier film 204 may include an atomic layer deposition process. In another embodiment, forming the first barrier film may include a high-density plasma chemical vapor deposition process.

In one embodiment, the first barrier film 204 formed by the atomic layer deposition process may have a strong step coverage capability at corners of the base substrate 200 and the edge fin 203 and at corners of the middle fin structure 202 and the base substrate 200, such that the formed first barrier film 204 may be substantially dense. The first barrier film 204 may be used to subsequently form a first barrier layer. Therefore, the first barrier layer may be substantially dense, and the first barrier layer may have a substantially strong ability to balance the force difference on sides of the edge fin 203, which may prevent the edge fin 203 from being deformed.

A thickness of the first barrier film 204 may be in a range of approximately 1.5 nm-6 nm. The first barrier film 204 may be used to subsequently form the first barrier layer. The thickness of the first barrier film 204 may determine a thickness of the first barrier layer.

Figure 4:
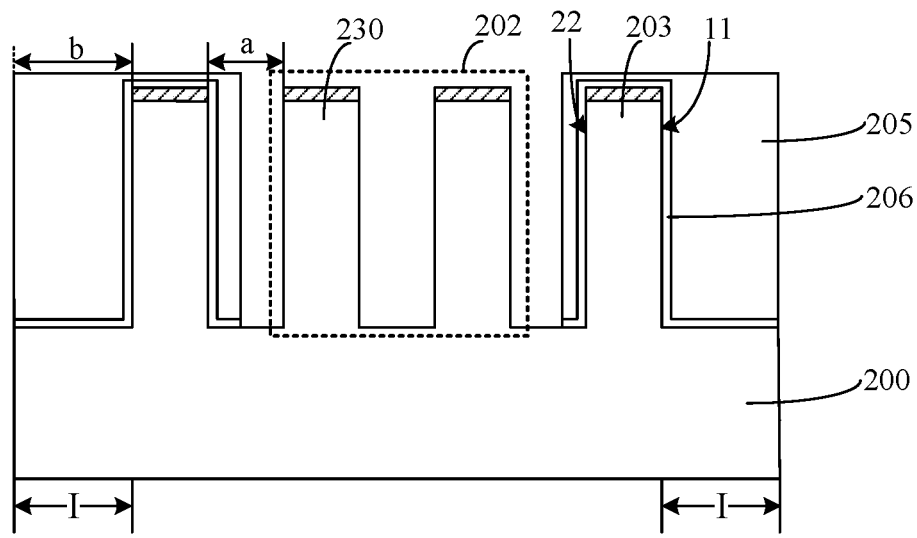

Returning to FIG. 10, after forming the first barrier film, a first barrier layer may be formed (S103). FIG. 4 illustrates a corresponding semiconductor structure.

Referring to FIG. 4, a photoresist layer 205 may be formed on the non-device regions I of the base substrate 200 and on the sidewall and top surfaces of the edge fin 203. The first barrier film 204 may be etched using the photoresist layer 205 as a mask until the sidewall and top surfaces of the middle fin structure 202 are exposed to form a first barrier layer 206 on the non-device regions I of the base substrate 200, and on the sidewall and top surfaces of the edge fin 203.

The photoresist layer 205 may protect the first barrier film 204 on the sidewalls of the edge fin 203 from being removed, which may facilitate forming the first barrier layer 206. Etching the first barrier film 204 using the photoresist layer 205 as a mask may include one or more of a dry etching process and a wet etching process.

Removing the first barrier film 204 on the sidewall and top surfaces of the middle fin structure 202 may facilitate to prevent the first barrier film 204 from causing a distance between the middle fin structure 202 and the edge fin 203 and a distance between adjacent first fins 230 in the middle fin structure 202 to be reduced. After removing the first barrier film 204 on the sidewall and top surfaces of the middle fin structure 202, the distance between the middle fin structure 202 and the edge fin 203 and the distance between the adjacent first fins 230 in the middle fin structure 202 may be substantially large, which may facilitate to reduce the difficulty of a subsequent filling with an isolation material layer between the middle fin structure 202 and the edge fin 203 and between the adjacent first fins 230.

The first barrier layer 206 may be formed from the first barrier film 204. Therefore, the first barrier layer 206 may be made of silicon oxide. A thickness of the first barrier layer 206 may be in a range of approximately 1.5 nm-6 nm.

The thickness of the first barrier layer 206 may be selected within a reasonable range. When the thickness of the first barrier layer 206 is less than 1.5 nm, the first barrier layer 206 may have a weak ability for buffering the force difference caused by the isolation material layer on sides of the edge fin 203. Therefore, the edge fin 203 may still be easily deformed, and, thus, the appearance difference between the edge fin 203 and the middle fin structure 202 may be substantially large, and the consistency of the performance of the semiconductor device may not be effectively improved. When the thickness of the first barrier layer 206 is larger than 6 nm, the thickness of the first barrier film 204 may have to be substantially thick, and the difficulty for removing the first barrier film 204 on the sidewall and top surfaces of the middle fin structure 202 may be substantially large.

Figure 5:
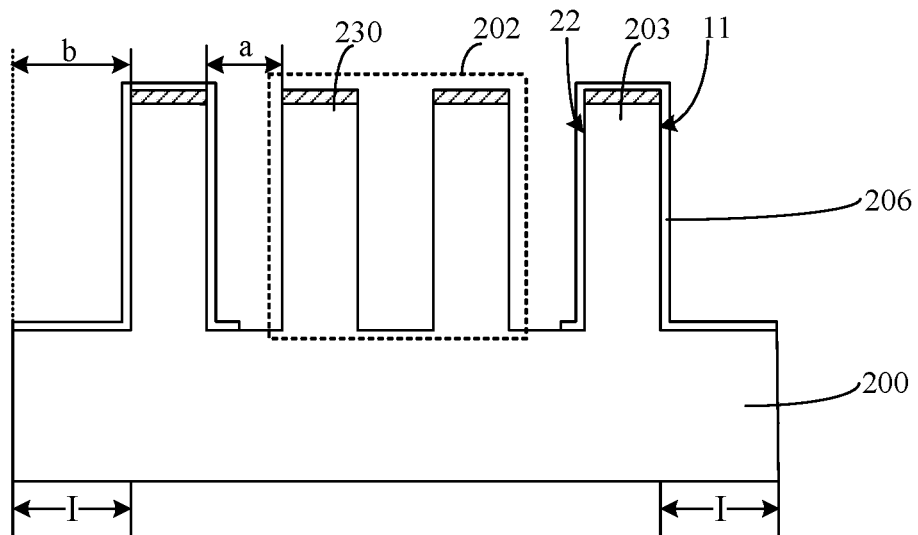

Returning to FIG. 10, after forming the first barrier layer, the photoresist layer may be removed (S104). FIG. 5 illustrates a corresponding semiconductor structure.

Referring to FIG. 5, after forming the first barrier layer 206, the photoresist layer 205 (illustrated in FIG. 4) may be removed. Removing the photoresist layer 205 may include one or more of a dry etching process, a wet etching process, and an ashing process.

When removing the photoresist layer 205, the first barrier layer 206 may protect the sidewalls of the edge fin 203 from being damaged, prevent the dimension reduction of the edge fin 203 in the direction perpendicular to the length direction of the edge fin 203, reduce the dimension difference between the first fin 230 in the middle fin structure 202 and the edge fin 203 in the direction perpendicular to the length direction of the edge fin 203, and facilitate to improve the consistency of the performance of the semiconductor device.

Figure 6:
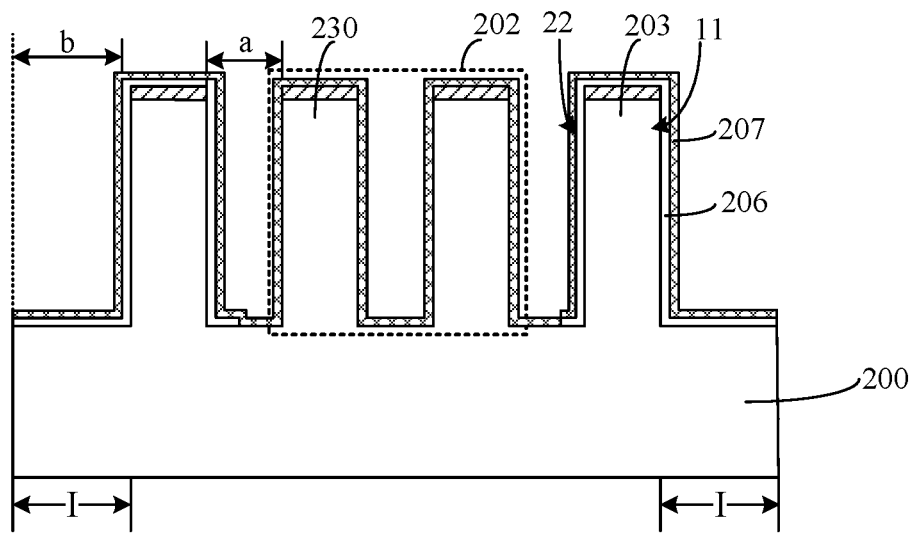

Returning to FIG. 10, after removing the photoresist layer, a second barrier layer may be formed (S105). FIG. 6 illustrates a corresponding semiconductor structure.

Referring to FIG. 6, a second barrier layer 207 may be formed on the base substrate 200, over the edge fin 203, on sidewalls of the first barrier layer 206, and on the sidewall and top surfaces of the middle fin structure 202. In one embodiment, the second barrier layer 207 may be made of silicon nitride. In another embodiment, the second barrier layer may be made of silicon oxide, or amorphous silicon, etc.

In one embodiment, forming the second barrier layer 207 may include an atomic layer deposition process. In another embodiment, forming the second barrier layer 207 may include a high-density plasma chemical vapor deposition process.

In one embodiment, the second barrier layer 207 formed by the atomic layer deposition process may have a strong step coverage capability at corners of the base substrate 200 and the edge fin 203 and at corners of the middle fin structure 202 and the base substrate 200, such that the formed second barrier layer 207 may be substantially dense. When subsequently forming an isolation material layer, the second barrier layer 207 may have a strong ability for buffering the force difference caused by the isolation material layer on sides of the edge fin 203. Therefore, the edge fin 203 may not be easily deformed, which may facilitate to reduce the appearance difference between the edge fin 203 and the first fin 230 in the middle fin structure 202, and to improve the consistency of the performance of the semiconductor device. In addition, when subsequently forming the isolation material layer, the second barrier layer 207 and the first barrier layer 206 may prevent loss of the sidewalls of the edge fin 203, which may facilitate improving the appearance of the edge fin 203.

Further, the second barrier layer 207 may cover the sidewall and top surfaces of the middle fin structure 202. When subsequently forming the isolation material layer, the second barrier layer 207 may prevent loss of the sidewalls and top of the middle fin structure 202, which may facilitate improving the appearance of the middle fin structure 202.

A thickness of the second barrier layer 207 may be in a range of approximately 2 nm-8 nm. The thickness of the second barrier layer 207 may be selected within a reasonable range. If the thickness of the second barrier layer 207 is less than 2 nm, when forming the isolation material layer, the second barrier layer 207 and the first barrier layer 206 may not have a sufficient ability for buffering the force difference on sides of the edge fin 203. Therefore, after forming the isolation material layer, the edge fin 203 may still be easily deformed. If the thickness of the second barrier layer 207 is larger than 8 nm, the distance between the edge fin 203 and the middle fin structure 202 and the distance between the adjacent first fins 230 may be substantially small, and, thus, the difficulty of a subsequent filling with the isolation material layer may be substantially large.

Figure 7:
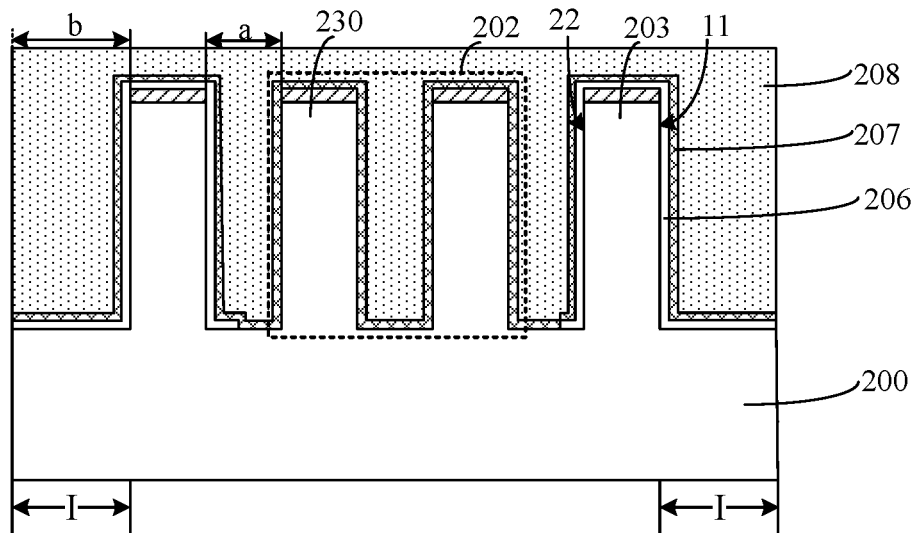

Returning to FIG. 10, after forming the second barrier layer, an isolation material layer may be formed (S106). FIG. 7 illustrates a corresponding semiconductor structure.

Referring to FIG. 7, an isolation material layer 208 may be formed over sidewalls of the second barrier layer 207. The isolation material layer 208 may be made of silicon oxide. Forming the isolation material layer 208 may include a fluid chemical vapor deposition process. Parameters of the fluid chemical vapor deposition process may include the following. A temperature may be in a range of approximately 30° C.-90° C., a silicon precursor may include $N(SiH_3)_3$, an oxygen precursor may include 02, a flow rate of the oxygen precursor may be in a range of approximately 20 mL/minute-10,000 mL/minute, and a pressure may be in a range of approximately 0.01 Torr-10 Torr.

When forming the isolation material layer 208, because the second dimension 'a' between the edge fin 203 and the middle fin structure 202 is equal to the spacing between the adjacent first fins 230, the force difference caused by the isolation material layer 208 on sides of the first fin 230 in the middle fin structure 202 may be substantially small, and, thus, the first fin 230 may not be easily deformed. That is, the middle fin structure 202 may not be easily deformed when forming the isolation material layer 208.

For the edge fin 203, the first sidewall 11 of the edge fin 203 may be affected by a thermal process of the isolation material layer 208 over the non-device region I, while the second sidewall 22 of the edge fin 203 may be affected by a thermal process of the isolation material layer 208 between the edge fin 203 and the middle fin structure 202. A volume of the isolation material layer 208 over the non-device region I may be larger than a volume of the isolation material layer 208 between the edge fin 203 and the middle fin structure 202, such that the influence of the thermal process of the isolation material layer 208 over the first sidewall 11 of the edge fin 203 may be greater than the influence of the thermal process of the isolation material layer 208 over the second sidewall 22 of the edge fin 203. The first barrier layer 206 and the second barrier layer 207 may buffer the difference between the thermal processes of the isolation material layer 208 over the first and second sidewalls of the edge fin 203, such that the edge fin 203 may not be easily deformed, which may facilitate to reduce the appearance difference between the edge fin 203 and the first fin 230 in the middle fin structure 202, and further to improve the consistency of the performance of the semiconductor device.

In addition, although the second dimension 'a' between the edge fin 203 and the middle fin structure 202 and the spacing between the adjacent first fins 230 may be substantially small, the thickness of the second barrier layer 207 may be substantially thin, such that the isolation material layer 208 may sufficiently fill the gaps between the edge fin 203 and the middle fin structure 202 and between the adjacent first fins 230. The formed isolation material layer 208 may be substantially dense, which may facilitate to improve the isolation performance of the isolation material layer 208.

When forming the isolation material layer 208, the second barrier layer 207 may prevent the loss of the edge fin 203 and the middle fin structure 202, which may facilitate to improve the appearance of the edge fin 203 and the middle fin structure 202.

Returning to FIG. 10, after forming the isolation material layer, an initial isolation layer may be formed (S107). FIG. 8 illustrates a corresponding semiconductor structure.

Referring to FIG. 8, an initial isolation layer 209 may be formed by planarizing the isolation material layer 208 until the mask layer on the tops of the edge fin 203 and the middle fin structure 202 is exposed. Planarizing the isolation material layer 208 may include a chemical mechanical polishing process.

When forming the initial isolation layer 209, the first barrier layer 206 and the second barrier layer 207 on the top of the edge fin 203 may be removed, and the second barrier layer 207 on the top of the middle fin structure 202 may be removed. The initial isolation layer 209 may expose the mask layer, which may facilitate a subsequent removal of the mask layer.

Returning to FIG. 10, after forming the initial isolation layer, an isolation layer may be formed (S108). FIG. 9 illustrates a corresponding semiconductor structure.

Referring to FIG. 9, an isolation layer 210 may be formed by removing the mask layer and a portion of the initial isolation layer 209 (illustrated in FIG. 8). A top surface of the isolation layer 210 may be lower than the top surfaces of the edge fin 203 and the middle fin structure 202. The isolation layer 210 may cover a portion of the sidewalls of the second barrier layer 207.

Removing the mask layer may include one or more of a dry etching process and a wet etching process. Removing the portion of the initial isolation layer 209 may include a wet etching process. The isolation layer 210 may electrically isolate different semiconductor devices.

After forming the isolation layer 210, the exposed second barrier layer 207 on the sidewall and top surfaces of the edge fin 203 and on the sidewall and top surfaces of the middle fin structure 202 may be removed. After removing the exposed second barrier layer 207 on the sidewall and top surfaces of the edge fin 203 and on the sidewall and top surfaces of the middle fin structure 202, the exposed first barrier layer 206 on the sidewall and top surfaces of the edge fin 203 may be removed. After removing the exposed first barrier layer 206 on the sidewall and top surfaces of the edge fin 203, a gate structure may be formed to cross the edge fin 203 and the middle fin structure 202. Source and drain doped regions may be formed in the edge fin 203 and in the middle fin structure 202 on both sides of the gate structure.

Accordingly, the present disclosure also provides a semiconductor structure. FIG. 7 illustrates a cross-sectional view of the semiconductor structure. Referring to FIG. 7, the semiconductor structure may include a base substrate 200. The base substrate 200 may include a plurality of non-device regions I. A middle fin structure 202 and an edge fin 203 disposed around the middle fin structure 202 may be formed on the base substrate 200 between adjacent non-device regions I.

The semiconductor structure may also include a first barrier layer 206 on sidewalls of the edge fin 203. Further, the semiconductor structure may include an isolation material layer 208 on the base substrate 200, on top of the edge fin 203, on sidewall and top surfaces of the middle fin structure 202, and on sidewalls of the first barrier layer 206.

The non-device region I may have a first dimension 'b' in a direction perpendicular to the sidewall of the edge fin 203, and the edge fin 203 may be spaced apart by a second dimension 'a' from the sidewall of the middle fin structure 202. The second dimension 'a' may be smaller than the first dimension 'b'. The first dimension 'b' may be above 56 nm, and the second dimension 'a' may be in a range of approximately 32 nm-40 nm.

The edge fin 203 may have a dimension in a range of approximately 6 nm-10 nm in the direction perpendicular to the sidewall of the edge fin 203. The first barrier layer 206 may be made of silicon oxide, silicon nitride, or amorphous silicon, etc. A thickness of the first barrier layer 206 may be in a range of approximately 1.5 nm-6 nm.

In one embodiment, the isolation material layer may be made of silicon oxide. The isolation material layer may have a material density smaller than the first barrier layer. In one embodiment, the semiconductor structure may further include an isolation layer. A top surface of the isolation layer may be lower than the top surfaces of the edge fin 203 and the middle fin structure 202. The isolation layer may cover a portion of each of the sidewalls of the edge fin 203 and the sidewalls of the middle fin structure 202. In one embodiment, the semiconductor structure may further include a gate structure across the edge fin 203 and the middle fin structure 202. In one embodiment, the semiconductor structure may further include source and drain doped regions in the edge fin 203 and in the middle fin structure 202 on both sides of the gate structure.

In the disclosed method for forming the semiconductor structure, before forming the isolation material layer, the first barrier layer may be formed on the sidewalls of the edge fin. Because the first barrier layer may have a material density greater than the isolation material layer, when forming the isolation material layer, the first barrier layer may balance the force difference caused by the isolation material layer on sides of the edge fin. Therefore, after forming the isolation material layer, the edge fin may not be easily deformed, such that the appearance difference between the edge fin and the first fin in the middle fin structure may be substantially small, which may facilitate to improve the consistency of the performance of the semiconductor device.

Further, a second barrier layer may be formed on the first barrier layer on the sidewalls of the edge fin. In one aspect, the second barrier layer may further balance the force difference caused by the isolation material layer over sides of the edge fin. In another aspect, when forming the isolation material layer, the second barrier layer and the first barrier layer may prevent the loss of the sidewalls of the edge fin, which may facilitate to improve the appearance of the edge fin.

Further, the second barrier layer may cover the sidewall and top surfaces of the middle fin structure. When forming the isolation material layer, the second barrier layer may prevent the loss of the sidewalls and top of the middle fin structure, which may facilitate to improve the appearance of the middle fin structure.

Further, as the integration degree of the semiconductor devices increases, the spacing between the edge fin and the middle fin structure may continue to decrease. When forming the first barrier layer, removing the first barrier film on the sidewall and top surfaces of the middle fin structure may enable the spacing between the edge fin and the middle fin structure to be substantially large. Therefore, the subsequent filling with the isolation material layer may be substantially simple, and the formed isolation material layer may be substantially dense. The isolation material layer may be used to subsequently form the isolation layer, and, thus, the isolation layer may be substantially dense, and may have desired performance for isolating different semiconductor devices.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
    providing a base substrate, wherein the base substrate includes a plurality of non-device regions;
    forming a middle fin structure and an edge fin disposed around the middle fin structure on the base substrate between adjacent non-device regions;
    forming a first barrier layer on sidewalls of the edge fin; and
    forming an isolation material layer over the base substrate, over a top of the edge fin, over sidewall and top surfaces of the middle fin structure, and over sidewalls of the first barrier layer, wherein the isolation material layer has a material density smaller than the first barrier layer.

2. The method according to claim 1, wherein:
    the first barrier layer further covers the top of the edge fin and the non-device regions of the base substrate; and
    forming the first barrier layer includes:
        forming a first barrier film on the base substrate, wherein the first barrier film covers the sidewall and top surfaces of the edge fin and the sidewall and top surfaces of the middle fin structure, and
        removing the first barrier film on the base substrate between the adjacent non-device regions and on the sidewall and top surfaces of the middle fin structure to form the first barrier layer on the non-device regions of the base substrate and on the sidewall and top surfaces of the edge fin.

3. The method according to claim 2, wherein:
    the first barrier film is made of one of silicon oxide and silicon nitride; and
    forming the first barrier film includes one of an atomic layer deposition process and a high-density plasma chemical vapor deposition process.

4. The method according to claim 1, wherein:
    the first barrier layer has a thickness in a range of approximately 1.5 nm-6 nm.

5. A method for fabricating a semiconductor structure, comprising:
    providing a base substrate, wherein the base substrate includes a plurality of non-device regions;
    forming a middle fin structure and an edge fin disposed around the middle fin structure on the base substrate between adjacent non-device regions;
    forming a first barrier layer on sidewalls of the edge fin; and
    forming an isolation material layer over the base substrate, over a top of the edge fin, over sidewall and top surfaces of the middle fin structure, and over sidewalls of the first barrier layer, wherein:
        the isolation material layer has a material density smaller than the first barrier layer
        a non-device region has a first dimension in a direction perpendicular to the sidewall of the edge fin; and
        the edge fin is spaced apart by a second dimension from the sidewall of the middle fin structure, wherein the second dimension is smaller than the first dimension.

6. The method according to claim 5, wherein:
    the first dimension is above 56 nm.

7. The method according to claim 5, wherein:
    the second dimension is in a range of approximately 32 nm-40 nm.

8. The method according to claim 1, wherein:
    the edge fin has a dimension in a range of approximately 6 nm-10 nm in a direction perpendicular to the sidewall of the edge fin.

9. The method according to claim 1, wherein:
    the isolation material layer is made of silicon oxide;
    forming the isolation material layer includes a fluid chemical vapor deposition process; and
    parameters of the fluid chemical vapor deposition process include:
    a temperature in a range of approximately 30° C.-90° C.,
    a silicon precursor including $N(SiH_3)_3$,
    an oxygen precursor including $O_2$,
    a flow rate of the oxygen precursor in a range of approximately 20 mL/minute-10,000 mL/minute, and
    a pressure in a range of approximately 0.01 Torr-10 Torr.

10. The method according to claim 1, after forming the first barrier layer and
    before forming the isolation material layer, further including:
        forming a second barrier layer on the base substrate, wherein the second barrier layer covers the sidewall and top surfaces of the edge fin and the sidewall and top surfaces of the middle fin structure.

11. The method according to claim 10, wherein:
the second barrier layer is made of one of silicon oxide, silicon nitride, and amorphous silicon.

12. The method according to claim 10, wherein:
the second barrier layer has a thickness in a range of approximately 2 nm-8 nm.

13. The method according to claim 1, after forming the isolation material layer, further including:
    forming an isolation layer by removing a portion of the isolation material layer, wherein the isolation layer has a top surface lower than the edge fin and the middle fin structure, and covers a portion of the sidewalls of the first barrier layer;
    after forming the isolation layer, removing exposed first barrier layer on the sidewalls of the edge fin;
    after removing the exposed first barrier layer on the sidewalls of the edge fin, forming a gate structure across the edge fin and the middle fin structure; and
    forming source and drain doped regions in the edge fin and the middle fin structure on both sides of the gate structure, respectively.

14. The method according to claim 5, wherein:
the first barrier layer further covers the top of the edge fin and the non-device regions of the base substrate; and
forming the first barrier layer includes:
    forming a first barrier film on the base substrate, wherein the first barrier film covers the sidewall and top surfaces of the edge fin and the sidewall and top surfaces of the middle fin structure, and
    removing the first barrier film on the base substrate between the adjacent non-device regions and on the sidewall and top surfaces of the middle fin structure to form the first barrier layer on the non-device regions of the base substrate and on the sidewall and top surfaces of the edge fin.

15. The method according to claim 14, wherein:
the first barrier film is made of one of silicon oxide and silicon nitride; and
forming the first barrier film includes one of an atomic layer deposition process and a high-density plasma chemical vapor deposition process.

16. The method according to claim 5, wherein:
the first barrier layer has a thickness in a range of approximately 1.5 nm-6 nm.

17. The method according to claim 5, wherein:
the edge fin has a dimension in a range of approximately 6 nm-10 nm in a direction perpendicular to the sidewall of the edge fin.

18. The method according to claim 5, wherein:
the isolation material layer is made of silicon oxide;
forming the isolation material layer includes a fluid chemical vapor deposition process; and
parameters of the fluid chemical vapor deposition process include:
a temperature in a range of approximately 30° C.-90° C.,
a silicon precursor including $N(SiH_3)_3$,
an oxygen precursor including $O_2$,
a flow rate of the oxygen precursor in a range of approximately 20 mL/minute-10,000 mL/minute, and
a pressure in a range of approximately 0.01 Torr-10 Torr.

19. The method according to claim 5, after forming the first barrier layer and before
    forming the isolation material layer, further including:
    forming a second barrier layer on the base substrate, wherein the second barrier layer covers the sidewall and top surfaces of the edge fin and the sidewall and top surfaces of the middle fin structure.

20. The method according to claim 19, wherein:
the second barrier layer is made of one of silicon oxide, silicon nitride, and amorphous silicon.

* * * * *